United States Patent
Ramalingam et al.

(10) Patent No.: US 10,931,280 B2
(45) Date of Patent: Feb. 23, 2021

(54) BIPOLAR JUNCTION TRANSISTOR BUFFER

(71) Applicant: TEXAS INSTRUMENTS INCORPORATED, Dallas, TX (US)

(72) Inventors: Sureshkumar Ramalingam, Bengaluru (IN); Ravpreet Singh, Bengaluru (IN)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 0 days.

(21) Appl. No.: 16/699,867

(22) Filed: Dec. 2, 2019

(65) Prior Publication Data

US 2020/0252067 A1 Aug. 6, 2020

(30) Foreign Application Priority Data

Feb. 5, 2019 (IN) .............................. 201941004468

(51) Int. Cl.
*H03K 19/003* (2006.01)
*H03K 19/0175* (2006.01)

(52) U.S. Cl.
CPC .............. *H03K 19/00376* (2013.01); *H03K 19/017545* (2013.01)

(58) Field of Classification Search
CPC ..... H03K 19/00376; H03K 19/017545; H03K 19/00307
See application file for complete search history.

(56) References Cited

U.S. PATENT DOCUMENTS

| 4,855,622 A | * | 8/1989 | Johnson | H03K 17/16 326/19 |
| 4,912,341 A | * | 3/1990 | Naghshineh | H03K 19/0136 326/129 |
| 5,021,687 A | * | 6/1991 | Yarbrough | H03K 3/0377 326/19 |

* cited by examiner

*Primary Examiner* — Daniel D Chang
(74) *Attorney, Agent, or Firm* — John R. Pessetto; Charles A. Brill; Frank D. Cimino

(57) ABSTRACT

A buffer circuit includes a first PNP BJT having a first base, a first collector and a first emitter. A first diode has a first cathode and a first anode. The first cathode couples to the first PNP BJT. A second diode has a second cathode and a second anode. The second anode couple to first base, and the second cathode couples to the first emitter. A voltage level shifter circuit coupled to the first anode. The voltage level shifter has a voltage level shifter output. A pre-driver circuit has a pre-driver input coupled to the voltage level shifter output. A second transistor has a second base, a second collector and a second emitter. The second base couples to the output of the pre-driver output. The second collector couples to a negative supply voltage node. The second emitter couples to an output node of the buffer circuit.

20 Claims, 3 Drawing Sheets

US 10,931,280 B2

BIPOLAR JUNCTION TRANSISTOR BUFFER

CROSS-REFERENCE TO RELATED APPLICATIONS

This application claims priority to India Provisional Application No. 201941004468, filed Feb. 5, 2019, which is hereby incorporated by reference.

BACKGROUND

Many types of analog circuits include transistors. One type of transistor is the bipolar junction transistor (BJT). Modern BJTs generally have a low rating for reverse emitter-to-base voltage (VEB). An NPN BJT, for example, has a base that is p-doped and a collector and an emitter that are n-doped. The emitter-base junction is reversed biased if the emitter's voltage is larger than the base voltage. A large enough reversed-biased emitter-base junction can damage the transistor. In one example, a reverse VEB voltage greater than approximately 2 V can damage a BJT.

SUMMARY

In one example, a buffer circuit includes a first PNP BJT having a first base, a first collector and a first emitter. A first diode has a first cathode and a first anode. The first cathode couples to the first PNP BJT. A second diode has a second cathode and a second anode. The second anode couple to first base, and the second cathode couples to the first emitter. A voltage level shifter circuit coupled to the first anode. The voltage level shifter has a voltage level shifter output. A pre-driver circuit has a pre-driver input coupled to the voltage level shifter output. A second transistor has a second base, a second collector and a second emitter. The second base couples to the output of the pre-driver output. The second collector couples to a negative supply voltage node. The second emitter couples to an output node of the buffer circuit.

BRIEF DESCRIPTION OF THE DRAWINGS

For a detailed description of various examples, reference will now be made to the accompanying drawings in which.

DETAILED DESCRIPTION

Figure 1:
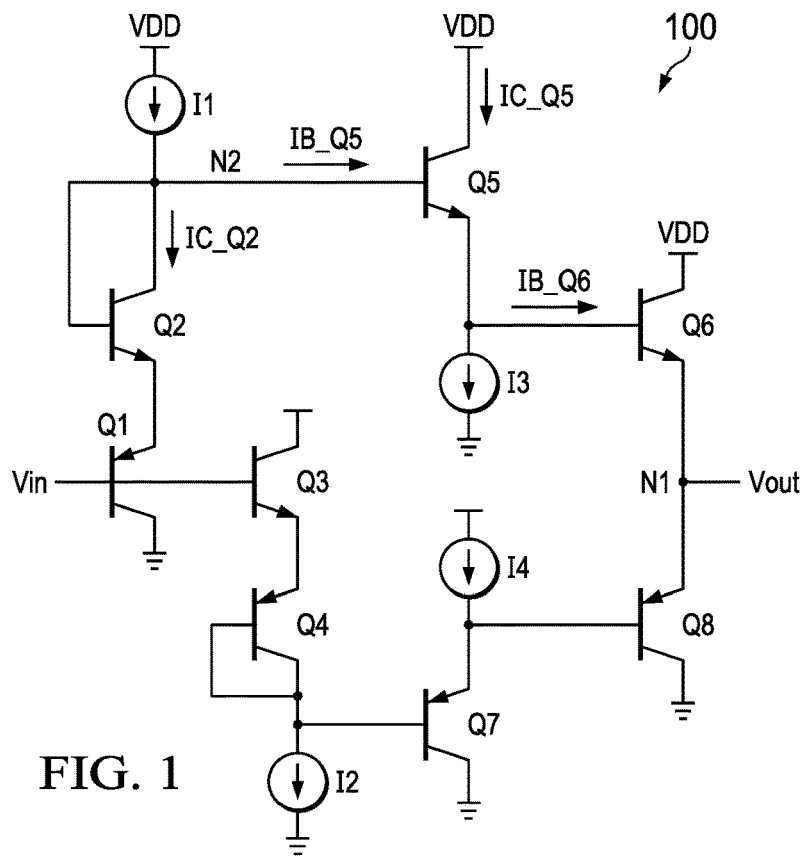
FIG. 1 illustrates an example of a BJT buffer susceptible to transistor damage due to an excessive reverse biased base-to-emitter junction.

FIG. 1 illustrates an example of a BJT buffer 100. The buffer receives an input voltage (Vin) and generates an output voltage (Vout) which generally matches Vin. The buffer 100 has a relatively large input impedance, and thus does not load (or loads only slightly) a driver that drives Vin to the buffer. In FIG. 1 and FIGS. 2-4, various transistors are connected to ground, but can be connected to a negative supply voltage (e.g., −VDD) instead. That is, the power supply can be unipolar (VDD and ground) or bipolar (VDD and −VDD).

Buffer 100 in this example includes BJT transistors Q1-Q6 and current sources I1-I4. Q1, Q4, Q7, and Q8 comprise PNP transistors, and Q2, Q3, Q5, and Q6 comprise NPN transistors. The emitters of Q1 and Q2 are connected together, and the collector of Q2 connects to the base of Q2, to current source I1, and to the base of Q5. The emitter of Q5 connects to the base of Q6 and to the current source I3. The buffer 100 has a symmetrical architecture meaning that the bottom half of the buffer is similarly configured to the top half with NPN transistors substituted for PNP transistors, and vice versa. Vin is coupled to base of both Q1 and Q3. The emitters of Q3 and Q4 are connected together. The collector of Q4 is connected to current source I2, the base of Q4, and to the base of Q7. The emitter of Q7 is connected to current source I4 and to the base of Q8. The emitters of Q6 and Q8 are connected together at a node N1 that provides Vout.

Vout changes in response to changes in Vin so as to remain equal to Vin. For example, if Vin increases (becomes a larger positive voltage), Q1's collector current will decrease and the collector current through Q2 (IC_Q2) will decrease as well. As current source I1 produces a constant level current, then the base current to Q5 (IB_Q5) will increase, which in turn, cause the collector current through Q5 (IC_Q5) to increase. As I3 also is a constant current source, then the increase in IC_Q5 will necessitate an increase in the base current of Q6 (IB_Q6). Turning on Q6 harder will cause Vout to be pulled up closer to the supply voltage VDD and remain in synch with Vin.

As noted above, BJTs can tolerate only a relatively small reverse bias voltage (e.g., 2 V) across their emitter-base junction. It is possible that the slew rate of Vout (the maximum rate at which Vout can change with respect to time) is smaller than the slew rate of Vin, which is controlled by a driver that produces Vin for the buffer 100. As such, brief periods of time are possible in which Vout does not equal Vin.

For example, Vin may experience a sudden jump from 0 V to 10 V. Vout was initially at 0 V as well, and begins to increase towards 10 V. However, it may take the buffer 100 more time to ramp Vout from 0 V to 10 V than it took for Vin to change from 0 V to 10 V. The voltage on node N2 is Vout plus the VBE of Q6 plus the VBE of Q5. A VBE voltage in one example is 0.7 V. Thus, the voltage on node N2 is VOUT+2*VBE (approximately 1.4 V greater than VOUT). In this example with Vout at 0 V, then the voltage on node N2 is 0+2*VBE, or 1.4 V. When Vin suddenly jumps up to 10 V, the for a brief period of time (until Vout rises to 10 V) the base of Q1 will be at 10V and node N2 will be at the much smaller voltage 1.4 V. As a result, a large reverse bias voltage of 10-1.4, or 8.6 V, will be present across Q1 and Q2 (between the base of Q1 and the collector/base of Q2. The emitter-base junctions of Q1 and Q2 will thus experience a large enough reverse bias voltage so as to possibly damage Q1 and Q2. The same problem is present with respect to Q3 and Q4 when VIN experiences a sudden decrease in voltage.

Figure 2:
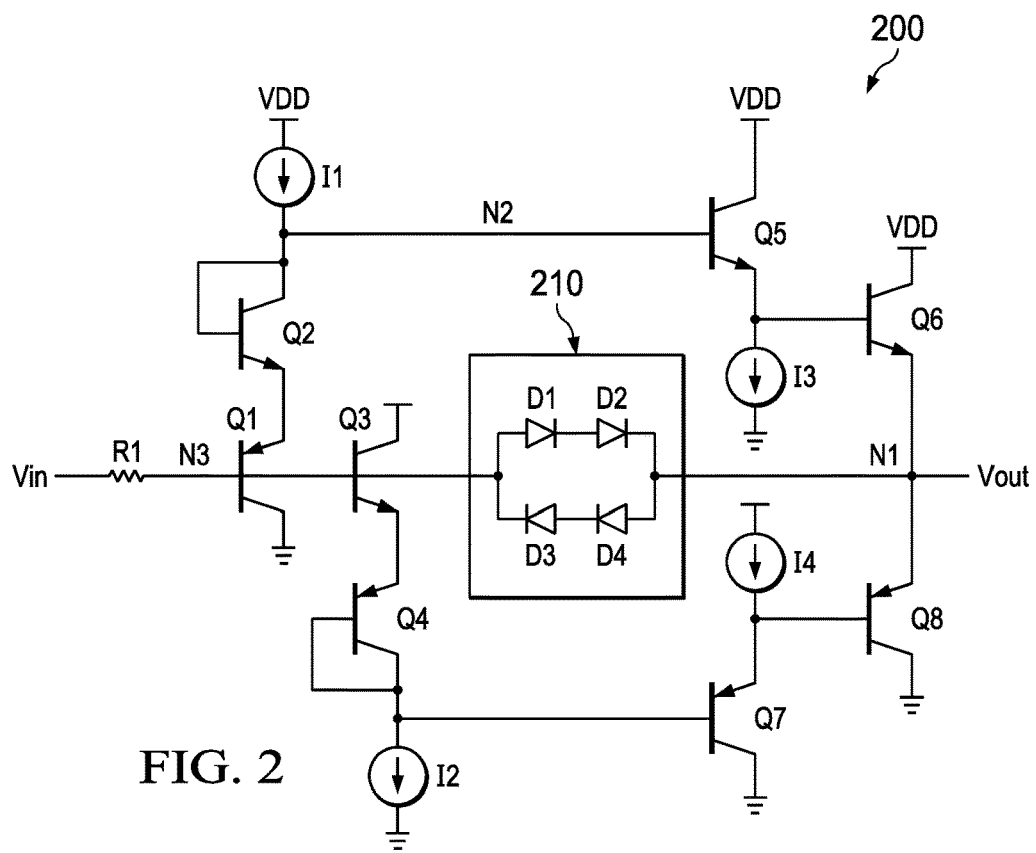
FIG. 2 illustrates an example of another BJT buffer including an input-to-output voltage clamp circuit.

FIG. 2 illustrates an example of a BJT buffer 200 that addresses the reverse bias VBE problem explained above regarding BJT buffer 100. The architecture of buffer 200 is the same as that of buffer 100 with the addition of input-to-output clamp circuit 210 between the input and the output of the buffer. A resistor R1 also is included between Vin and the bases of Q1 and Q3 (node N3). In this example, the input-to-output clamp circuit 210 comprises diodes D1-D4.

D1 and D2 are connected in series between nodes N3 and N1, and D3 and D4 are connected in series, but with the opposite polarity, between N3 and N1. When Vout equals Vin, none of the D1-D4 are on. However, if Vin is larger than Vout (as in the example above in which Vin jumps to 10 V while Vout temporarily is at 0V), then D1 and D2 turn on. The forward bias voltage of D1 and D2 is, in one example, 0.7 V and thus the combination of D1 and D2 clamps the voltage on node N3 to be about 1.4 V above Vout. Resistor R1 is present to limit the current through the diodes within the input-to-output clamp circuit 210 that are on, and itself produces a small voltage drop.

When Vin is larger than Vout, the input-to-output clamp circuit 210 clamps the voltage on node N3 to be a voltage close to Vout. The diodes D1 and D2 turn on much more rapidly than the inherent slew rate of Vout. As such, the voltage on node N2 increase rapidly when D1 and D2 turn on, and thus the voltage on node N2 (which is 2*VBE above VOUT) also becomes large, and large enough to avoid a reverse bias VBE voltage across Q1 and Q2 large enough to damage those transistors. The same response occurs when VIN experiences a sudden decrease—D3 and D4 turn on and pull Vout down rapidly as well.

While solving the reverse bias VBE problem of buffer 100, two problems are created by including the input-to-output clamp circuit 210 and resistor R1. First, when one string of diodes D1/D2 or D3/D4 turn on in response to a sudden change in Vin, the input impedance of the buffer 200 drops precipitously, which is counterproductive for a buffer whose purpose is to provide a high input impedance. Second, the inclusion of resistor R1 limits the maximum bandwidth and slew rate of the buffer.

Figure 3:
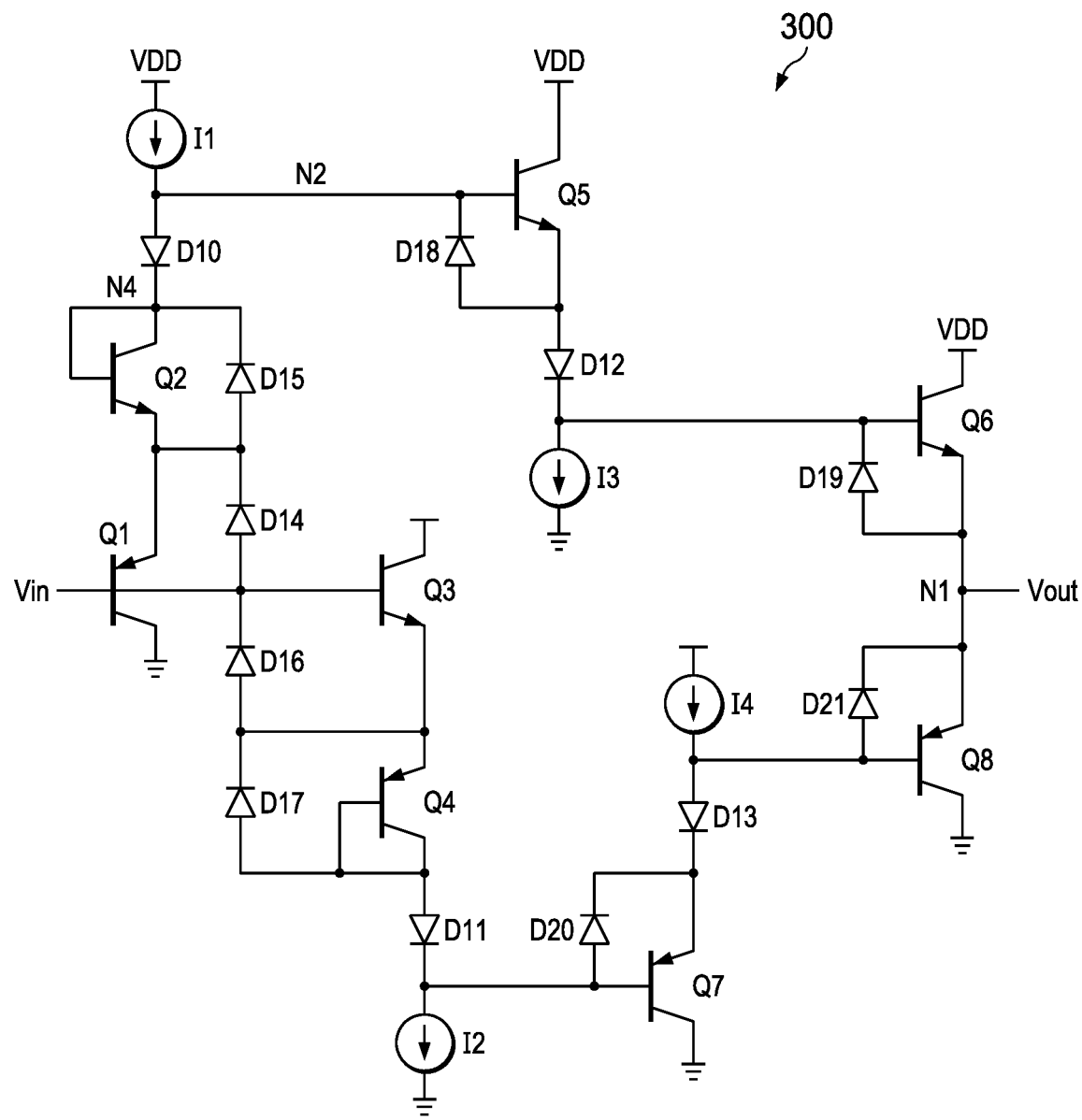
FIG. 3 illustrates an example of yet another BJT buffer that solves the potential transistor damage problem without an input-to-output voltage clamp circuit.

FIG. 3 illustrates a BJT buffer 300 that also addresses the reverse bias VBE problem explained above regarding BJT buffer 100 but does so differently than buffer 200. The general architecture of buffer 300 is the same as that of buffer 100 with the addition of diodes D10-D21. D10 is connected between the base/collector of Q2 and the base of Q5 (as well as current source I1). The anode of D10 is connected to the base of Q5 and the cathode of D10 is connected to Q2. D11 is connected between the base/collector of Q4 and the base of Q7 (as well as current source I2). The cathode of D11 is connected to the base of Q7 and the anode of D11 is connected to Q4. D12 is connected between the emitter of Q5 and the base of Q6 (as well as current source I3). The anode of D12 is connected to the emitter of Q5 and the cathode of D12 is connected to the base of Q6. Similarly, D13 is connected between the emitter of Q7 and the base of Q8 (as well as current source I4). The cathode of D13 is connected to the emitter of Q7 and the anode of D13 is connected to the base of Q8.

D14 is connected between the base and emitter of Q1 (anode connected to base and cathode connected to emitter). D15 is connected between the base and emitter/collector) of Q2 (anode connected to emitter and cathode connected to base/collector). D16 is connected between the base and emitter of Q3 (anode connected to emitter and cathode connected to base). D17 is connected between the base and emitter/collector) of Q4 (cathode connected to emitter and anode connected to base/collector). D18 is connected between the base and emitter of Q5 (cathode connected to base and anode connected to emitter). D19 is connected between the base and emitter of Q6 (cathode connected to base and anode connected to emitter). D20 is connected between the base and emitter of Q7 (anode connected to base and cathode connected to emitter). D21 is connected between the base and emitter of Q8 (anode connected to base and cathode connected to emitter).

During steady state (i.e., Vout equals Vin), the voltage on node N2 is Vout+2*VBE (due to Q5 and Q6)+1*Vd (forward voltage of D12). D14 and D15 turn on when Vin is larger than Vout (not during the steady state), and thus Vin is larger than the voltage on node N2. When D14 and D15 turn on, the voltage on node N4 is forced to be Vin less the combined voltage drops of D14 and D15 (about 1.4 V). Thus, the reverse bias voltage across Q1 and Q2 is only about 1.4 V, which is a safe reverse bias VBE voltage for Q1 and Q2. The voltage on node N2 (anode of D10) is Vout+ 2*VBE+1*Vd, as explained above. The voltage on the node N4 (cathode of D10) is Vin minus 2*Vd (voltage drop across D14 and D15). In the example in which Vin is 10 V and Vout is 0 V, the reverse bias voltage across D10 will be approximately 10V−3*Vd−2*VBE (approximately 6.5 V). D10 will not be damaged by a reverse bias voltage of 6.5V. As such, the buffer 300 clamps the reverse bias VBE voltage across Q1/Q2 to a safe level and includes a device (D10) to absorb a large portion of the voltage difference between Vin and the voltage on node N2. By forcing a large (but not damaging) reverse bias voltage across D10, a smaller and safer reverse bias voltage is present across Q1 and Q2. Diodes D14 and D15 also provide a current path for any reverse bias leakage current through D10. Further, because a relatively large reverse bias voltage may be imposed on D10 and D11, the breakdown voltage of D10 and D11 should be greater than the anticipated maximum reverse bias voltage for D10 and D11. In one example, the breakdown voltage of D10 and D11 is greater than the supply voltage, VDD.

The steady state (Vout equals Vin) voltage on node N2 in FIG. 3 is equal to Vout plus the VBE voltages of Q6 and Q5 plus the forward bias voltage drop across D12. As such, the steady state voltage on node N2 for the buffer 300 of FIG. 3 is larger than the steady state voltage on node N2 for the buffer 200 of FIG. 2. As a result of the extra diode voltage drop due to D12 (and a comparable voltage drop due to the D13), more headroom is needed for buffer 300 than for buffer 200, and thus all else being equal a higher supply voltage is needed for buffer 300.

Figure 4:
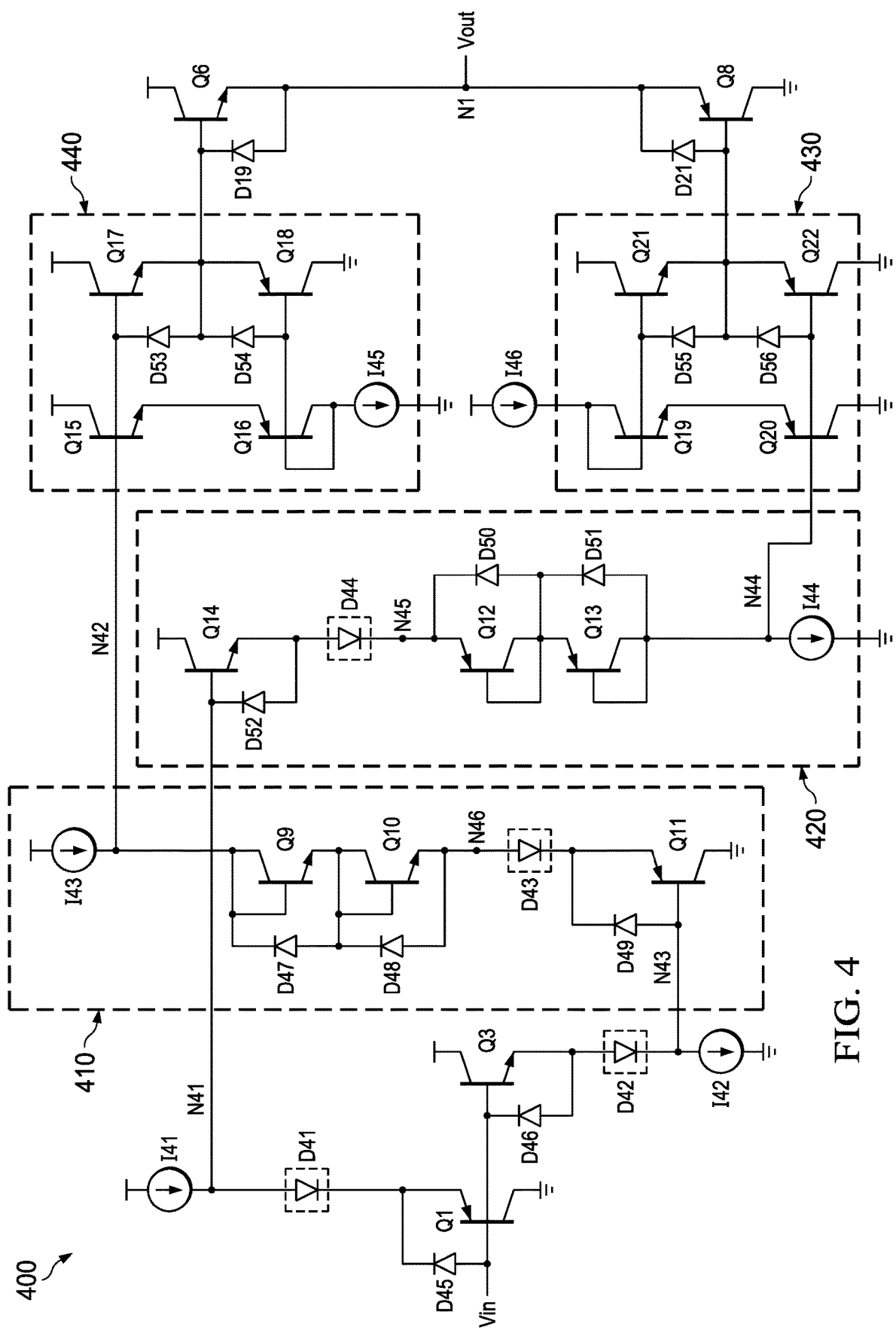
FIG. 4 illustrates an example of BJT buffer that solves the potential transistor damage problem without an input-to-output voltage clamp circuit and with lower headroom than the buffer example of FIG. 3.

FIG. 4 shows another example of a buffer 400 that solves the headroom issue of buffer 300 of FIG. 3. In this example, buffer 400 includes transistors Q1, Q3, Q6, and Q8 as well as transistors Q15-Q22, diodes D19, D21, D41, D42, D45, D46, and D53-D56, current sources I41, I42, I45 and I46, and voltage level shifter circuits 410 and 420. As noted above, transistors Q1 and Q8 comprise PNP BJTs and transistors Q3 and Q6 comprise NPN BJTs.

Voltage level shifter circuit 410 includes transistors Q9, Q10, and Q11, diodes D43, D47, D48, and D49, and current source I43. Transistors Q9 and Q10 comprises NPN BJTs and transistor Q11 comprises a PNP transistor. The collector of Q9 is connected to current source I43 at node N42 and to its base. The emitter of Q9 is connected to the collector of Q10 and to the base of Q10. The emitter of Q10 is connected to the anode of D43 at node N46, and the cathode of D43 is connected to the emitter of Q11. D47 is connected between the base and emitter of Q9, with the cathode of D47 connected to the base of Q9 and the anode of D47 connected to the emitter of Q9. D48 is connected between the base and emitter of Q10, with the cathode of D48 connected to the base of Q10 and the anode of D48 connected to the emitter of Q10. D49 is connected between the base and emitter of Q11, with the cathode of D49 connected to the emitter of Q11 and the anode of D49 connected to the base of Q11. When diodes D47-D49 are on, the reverse bias VBE voltage of transistors Q9-Q11 is clamped at the forward bias voltage of the respective D47-D49, thereby protecting Q9-Q11 from excessive reverse bias VBE voltage.

Voltage level shifter circuit 420 includes transistors Q12, Q13, and Q14, diodes D44, D50, D51, and D52, and current source I44. Transistors Q12 and Q13 comprises PNP BJTs and transistor Q14 comprises an NPN transistor. The collector of Q13 is connected to current source I44 and to its base. The emitter of Q13 is connected to the collector of Q12 and to the base of Q12. The emitter of Q12 is connected to the cathode of D44 at node N45, and the anode of D44 is connected to the emitter of Q14. D50 is connected between the base and emitter of Q12, with the anode of D50 connected to the base of Q12 and the cathode of D50 connected to the emitter of Q12. D51 is connected between the base and emitter of Q13, with the anode of D51 connected to the base of Q13 and the cathode of D51 connected to the emitter of Q13. D52 is connected between the base and emitter of Q14, with the anode of D52 connected to the emitter of Q14 and the cathode of D52 connected to the base of Q14. When diodes D50-D52 are on, the reverse bias VBE voltage of transistors Q12-Q14 is clamped at the forward bias voltage of the respective D50-D52, thereby protecting Q12-Q14 from excessive reverse bias VBE voltage.

Vin is provided to the base of Q1 and Q3, as explained above. The emitter of Q1 is connected to the cathode of D41, and the anode of D41 is connected to current source I41 and to the base of Q14 at node N41. The bases of Q20 and Q22 are connected to the collector Q13 and to current source I44 at node N43. Transistors Q19-Q22 form a pre-driver 430 for Q8. The emitters of Q19 and Q20 are connected together, and the collector of Q19 is connected to its base, the base of Q21 and to current source I46. The emitters of Q21 and Q22 also are connected together and to the base of Q8. D55 is connected between the base and emitter of Q21 with the cathode of D55 connected to the base of Q21 and the anode of D55 connected to the emitter of Q21. D56 is connected between the base and emitter of Q22 with the anode of D56 connected to the base of Q22 and the cathode of D56 connected to the emitter of Q22. D21 is connected between the base and emitter of Q8 with the anode of D21 connected to the base of Q8 and the cathode of D21 connected to the emitter of Q8.

The emitter of Q3 is connected to the anode of D42, and the cathode of D43 is connected to current source I43 and to the base of Q11 at node N43. The bases of Q15 and Q17 are connected to the collector Q9 and to current source I43 at node N42. Transistors Q15-Q18 form a pre-driver 440 for Q6. The emitters of Q15 and Q16 are connected together, and the collector of Q16 is connected to its base, the base of Q18 and to current source I45. The emitters of Q17 and Q18 also are connected together and to the base of Q6. D53 is connected between the base and emitter of Q17 with the cathode of D53 connected to the base of Q17 and the anode of D53 connected to the emitter of Q17. D54 is connected between the base and emitter of Q18 with the anode of D54 connected to the base of Q18 and the cathode of D54 connected to the emitter of Q18. D19 is connected between the base and emitter of Q6 with the cathode of D29 connected to the base of Q6 and the anode of D19 connected to the emitter of Q6.

Pre-driver circuit 430 controls the base of Q8. The input to the pre-driver circuit 430 is node N44 which is connected to the collector of Q13 of the voltage level shifter circuit 420, and the input to the voltage level shifter circuit 420 is node N41 which couples through D41 to Q1. As such, changes in the collector current Q1 causes changes in the current through Q12-Q14 of the voltage level shifter circuit 420, and thus to the pre-driver 430 for Q8. Similarly, pre-driver circuit 440 controls the base of Q6. The input to the pre-driver circuit 430 is node N44 which is connected to the collector of Q13 of the voltage level shifter circuit 420, and the input to the voltage level shifter circuit 420 is node N41 which couples through D41 to Q1. As such, changes in the collector current Q1 causes changes in the current through Q12-Q14 of the voltage level shifter circuit 420, and thus to the pre-driver 430 for Q6.

Referring still to FIG. 4, the voltage on node N45 is approximately equal to Vout. From node N1 (Vout), the voltage on node N42 is equal to Vout plus the forward VBE voltage of Q6 and Q7. Then, the voltage on node N42 decreases by 2 VBE voltage drops due to Q9 and Q10 onto node N46. As such, the voltage on node N46 is equal to Vout. Similarly, the voltage on node N45 also is equal to Vout.

During the steady state (Vout equals Vin), D45 and D46 are reverse biased and thus off, and D41 and D42 are forward biased and thus on. If, however, Vin jumps up faster than the slew rate for Vout, Vin will be larger (more positive) than the voltage on node N45. In response, D45 turns on to clamp the reverse bias VBE voltage across Q1 to protect Q1, and a reverse bias voltage will be imposed across D41 to absorb the potential difference between Vin and the voltage on node N45 less the forward voltage drops across D45 and D44 and the forward VBE voltage of Q14. Further, D19 becomes forward biased to clamp the reverse bias VBE voltage of Q11 when Vin is larger than Vout thereby protecting Q11. Further, reverse voltage is imposed on D43 which protects Q19 and Q10 along with D47 and D48.

Similarly, if Vin decreases faster than the slew rate for Vout, a negative potential difference will be present for Vin relative to the voltage on node N46. In response, D46 turns on to clamp the reverse bias VBE voltage across Q3 to protect Q3, and a reverse bias voltage will be imposed across D42 to absorb the potential difference between Vin and the voltage on node N46 less the forward voltage drops across D46 and D43 and the forward VBE voltage of Q11. Further, D52 becomes forward biased to clamp the reverse bias VBE voltage of Q14 when Vin is smaller (less positive) than Vout thereby protecting Q14.

D19, D21, D47, D48, D50, D51, and D53-D56 are connected between the base and emitter of respective transistors D6, Q8, Q9, Q10, D12, D13, Q17, Q18, A21, and Q22. A given diode D19, D21, D47, D48, D50, D51, and D53-D56 will turn on when forward biased to protect the respective transistor from a potentially damaging reverse bias VBE voltage.

During the steady state and as explained above, the voltage on node N42 is equal to Vout plus the forward VBE voltage of both Q6 and Q17. That voltage is smaller than the voltage on node N2 in FIG. 3. The voltage on node N2 is equal to Vout plus the forward VBE voltage of both Q5 and Q6 plus the forward bias voltage of D12. In FIG. 4, the voltage on node N41 is VIN plus the VBE of Q1 plus the forward bias voltage of D41, and thus the voltage on node N41 also is smaller than the voltage on node N2 in FIG. 3. The same analysis applies for the voltages on nodes N43 and N44 relative to the voltage on the anode D20 in FIG. 3. Consequently, all else being equal less headroom is needed for buffer 400 (FIG. 4) than for buffer 300 (FIG. 3), and thus a smaller voltage power supply can be used for buffer 400 than for buffer 300.

"The term "couple" is used throughout the specification. The term may cover connections, communications, or signal paths that enable a functional relationship consistent with the description of the present disclosure. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A.

What is claimed is:

1. A buffer circuit, comprising:
   a first bipolar junction transistor (BJT) having a first base, a first collector and a first emitter, the first base configured to receive a buffer input signal;
   a first diode having a first cathode and a first anode, the first cathode coupled to the emitter of the first BJT;
   a second diode having a second cathode and a second anode, the second anode coupled to the first base, and the second cathode coupled to the first emitter;
   a first voltage level shifter circuit coupled to the first anode, the first voltage level shifter having a first voltage level shifter output;
   a first pre-driver circuit having a first pre-driver input coupled to the first voltage level shifter output, the first pre-driver circuit having a first pre-driver output; and
   a second BJT transistor having a second base, a second collector and a second emitter, the second base coupled to the first pre-driver output, and the second collector coupled to a negative supply voltage node, the second emitter coupled to an output of the buffer circuit.

2. The buffer circuit of claim 1, further comprising:
   a third BJT having a third base, a third collector and a third emitter;
   a third diode having a third cathode and a third anode, the third anode coupled to the third emitter;
   a fourth diode having a fourth cathode and a fourth anode, the fourth cathode coupled to third base and the fourth anode coupled to the third emitter;
   a second voltage level shifter circuit coupled to the third cathode, the second voltage level shifter having a second voltage level shifter output;
   a second pre-driver circuit having a second pre-driver input coupled to the second voltage level shifter output, the second pre-driver circuit having a second pre-driver output; and
   a fourth BJT having a fourth base, a fourth collector and a fourth emitter, the fourth base coupled to the second pre-driver output, and the fourth collector coupled to a positive supply voltage, the second and fourth BJTs coupled together.

3. The buffer circuit of claim 2, wherein:
   the first voltage level shifter circuit includes a fifth BJT, a fifth diode, and a first current source device, the fifth transistor coupled to the first anode, and the fifth diode coupled between the fifth BJT and the first current source device; and
   the second voltage level shifter circuit includes a sixth BJT, a sixth diode, and a second current source device, the sixth transistor coupled to the third cathode, and the sixth diode coupled between the sixth BJT and the second current source device.

4. The buffer circuit of claim 2, wherein the first diode has a breakdown voltage configured to be larger than a supply voltage for the buffer circuit, and the third diode has a breakdown voltage configured to be larger than the supply voltage for the buffer circuit.

5. The buffer circuit of claim 1, wherein the first voltage level shifter circuit includes:
   a fifth BJT coupled to the first anode;
   a first current source device; and
   a fifth diode coupled between the fifth BJT and the first current source device.

6. The buffer circuit of claim 5, wherein the first voltage level shifter circuit further includes two series-connected transistors between the fifth transistor and the first voltage level shifter output.

7. The buffer circuit of claim 1, wherein:
   when an output voltage on the output of the buffer circuit is equal to a voltage of the buffer input signal, the second diode is configured to be reverse biased; and
   when the output voltage on the output of the buffer circuit is not equal to the voltage of the buffer input signal, the second diode is configured to be forward biased thereby clamping a reverse bias voltage between the first base and the first emitter.

8. The buffer circuit of claim 1, wherein the first diode has a breakdown voltage configured to be larger than a supply voltage for the buffer circuit.

9. The buffer circuit of claim 1, further comprising a third diode having a third cathode and a third anode cathode, the third cathode coupled to third base, and the third anode coupled to the third emitter.

10. A buffer circuit, comprising:
    a PNP bipolar junction transistor (BJT) configured to receive a buffer input signal;
    an NPN BJT also configured to receive the buffer input signal;
    a first diode having a first cathode and a first anode, the first cathode coupled to the PNP BJT;
    a second diode having a second cathode and a second anode, the second anode coupled to the NPN BJT;
    a first voltage level shifter circuit coupled to the first anode, the first voltage level shifter having a first voltage level shifter output;
    a second voltage level shifter circuit coupled to the second cathode, the second voltage level shifter having a second voltage level shifter output;
    a first pre-driver circuit coupled to the first voltage level shifter;
    a second pre-driver circuit coupled to the second voltage level shifter output;
    a first transistor coupled to the first pre-driver circuit and an output of the buffer circuit; and
    a second transistor coupled to the second pre-driver circuit and the output of the buffer circuit.

11. The buffer circuit of claim 10, wherein:
    the first voltage level shifter circuit includes a third transistor, a third diode, and a first current source device, the third transistor coupled to the first anode, and the third diode coupled between the third transistor and the first current source device; and
    the second voltage level shifter circuit includes a fourth transistor, a fourth diode, and a second current source device, the fourth transistor coupled to the second cathode, and the fourth diode coupled between the fourth transistor and the second current source device.

12. The buffer circuit of claim 10, wherein the first diode has a breakdown voltage configured to be larger than a supply voltage for the buffer circuit, and the third diode has a breakdown voltage configured to be larger than the supply voltage for the buffer circuit.

13. The buffer circuit of claim 10, wherein the first voltage level shifter circuit includes:

a third transistor coupled to the first anode;
a first current source device; and
a third diode coupled between the third transistor and the first current source device.

14. The buffer circuit of claim 13, wherein the first voltage level shifter circuit further includes two series-connected transistors between the third transistor and the first current source device.

15. The buffer circuit of claim 10, further comprising a third diode connected between a base and an emitter of the first transistor and comprising a fourth diode connected between a base and an emitter of the second transistors.

16. The buffer circuit of claim 15, wherein:
when an output voltage on the output of the buffer circuit is equal to a voltage of the buffer input signal, both the third and fourth diodes are configured to be reverse biased; and
when the output voltage on the output of the buffer circuit is not equal to the voltage of the buffer input signal, one of the third or fourth diodes is configured to be forward biased thereby clamping a reverse bias voltage between the base and the emitter of the respective first or second transistor coupled to the third or fourth diode that is reverse biased.

17. A buffer circuit, comprising:
a first bipolar junction transistor (BJT) having a first base, a first collector and a first emitter, the first base configured to receive a buffer input signal;
a first diode coupled to the emitter of the first BJT;
a second diode coupled between the first base and first emitter;
a first voltage level shifter circuit coupled to the first diode, the first voltage level shifter having a first voltage level shifter output;
a first pre-driver circuit having a first pre-driver input coupled to the first voltage level shifter output, the first pre-driver circuit having a first pre-driver output; and
a second BJT having a second base, a second collector and a second emitter, the second base coupled to the first pre-driver output, and the second emitter coupled to an output of the buffer circuit.

18. The buffer circuit of claim 17, wherein the first BJT comprises a PNP transistor and the second BJT comprises a PNP transistor.

19. The buffer circuit of claim 17, further comprising:
a third BJT having a third base, a third collector and a third emitter, the third base configured to receive the buffer input signal;
a third diode coupled to the third BJT;
a fourth diode coupled between the third base and third emitter;
a second voltage level shifter circuit coupled to the third diode, the second voltage level shifter having a second voltage level shifter output;
a second pre-driver circuit having a second pre-driver input coupled to the second voltage level shifter output, the second pre-driver circuit having a second pre-driver output; and
a fourth BJT having a fourth base, a fourth collector and a fourth emitter, the fourth base coupled to the second pre-driver output, and the fourth emitter coupled to the output of the buffer circuit.

20. The buffer circuit of claim 19, wherein the first and second BJTs comprises PNP transistors and the third and fourth BJTs comprises NPN transistors.

* * * * *